(12) United States Patent
Roth et al.

(10) Patent No.: US 8,106,686 B2
(45) Date of Patent: Jan. 31, 2012

(54) INTEGRATED CIRCUIT

(75) Inventors: Harald Roth, Munich (DE); Helmut Schneider, Munich (DE)

(73) Assignee: Qimonda AG, Munich (DE)

( * ) Notice: Subject to any disclaimer, the term of this patent is extended or adjusted under 35 U.S.C. 154(b) by 21 days.

(21) Appl. No.: 12/234,398

(22) Filed: Sep. 19, 2008

(65) Prior Publication Data

US 2009/0085644 A1  Apr. 2, 2009

(30) Foreign Application Priority Data

Sep. 28, 2007  (DE) .......................... 10 2007 046 729

(51) Int. Cl.
*H03K 3/00* (2006.01)
(52) U.S. Cl. ....................................................... 327/112
(58) Field of Classification Search .................. None
See application file for complete search history.

(56) References Cited

U.S. PATENT DOCUMENTS

| | | | |
|---|---|---|---|
| 6,430,091 B2 | 8/2002 | Tanizaki | |
| 6,445,222 B1* | 9/2002 | Hidaka et al. | 327/108 |
| 7,205,810 B1* | 4/2007 | Lee et al. | 327/231 |
| 2002/0057601 A1 | 5/2002 | Sakamoto et al. | |
| 2002/0063586 A1* | 5/2002 | Kiehl | 327/108 |
| 2005/0135163 A1* | 6/2005 | Schneider et al. | 365/189.09 |
| 2006/0209607 A1* | 9/2006 | Menczigar et al. | 365/207 |

* cited by examiner

*Primary Examiner* — Lincoln Donovan
*Assistant Examiner* — Khareem E Almo
(74) *Attorney, Agent, or Firm* — John S. Economou

(57) ABSTRACT

An integrated circuit includes an input terminal for applying an input signal, a further input terminal for applying a further input signal having a level differing from the level of the initial input signal, an output terminal for providing an output signal, a switching unit having a controllable switch, which is arranged between the input terminal and the output terminal, and a further switching unit, which is arranged between the further input terminal and the output terminal. The integrated circuit is operated in a first and subsequent second operating state. The controllable switch of the switching unit is controlled to be conductive in the first and second operating state. In the first operating state, the output signal is provided in dependence on the level of the input signal, and in the second operating state in dependence on the level of the second input signal.

10 Claims, 5 Drawing Sheets

US 8,106,686 B2

INTEGRATED CIRCUIT

This application claims priority to German Patent Application 10 2007 046 729.1, which was filed Sep. 28, 2007 and is incorporated herein by reference.

TECHNICAL FIELD

The invention relates to an integrated circuit generating an output signal having a high level, which is used, for example, for controlling a transistor operating as a switch, which connects different networks.

BRIEF DESCRIPTION OF THE DRAWINGS

Embodiments of the present invention will be detailed subsequently referring to the appended drawings, in which.

DETAILED DESCRIPTION OF ILLUSTRATIVE EMBODIMENTS

Read amplifiers are used in the cell field of a memory chip, which amplify a voltage on a bit line that results, for example, from reading out a memory cell. In a so-called shared SA concept, a read amplifier is connected on both sides to one bit line pair each. If memory access to a memory cell connected to one of the two bit line pairs takes place, the other of the bit line pairs has to be disconnected from the read amplifier. Disconnecting a deactivated bit line and connecting the active bit line to the read amplifier, respectively, is performed via an isolating transistor (MUX device), which is connected between the read amplifier and the connected bit line.

For controlling the isolating transistor to be conductive or non-conductive, respectively, a control signal having a control voltage level is applied to a control terminal of the transistor. For writing a 1-data value, the read amplifier generates a high output voltage, which has to be transmitted via the controllable path of the isolating transistor, in order to be fed into the activated bit line. For transmitting a high load via the control path of the isolating transistor, the control voltage (gate voltage) for controlling the isolating transistor to be conductive has to be significantly higher than the voltage level representing the 1-data value. Typically, the high control voltage has to be pumped from a supply voltage of the semiconductor memory with low efficiency.

The capacitive load of the control signal is very high, since the control signal is fed into all control terminals of the isolating transistors of a read amplifier strip. Every switch process of the isolating transistor contributes significantly to the overall current consumption during activation.

Figure 1:
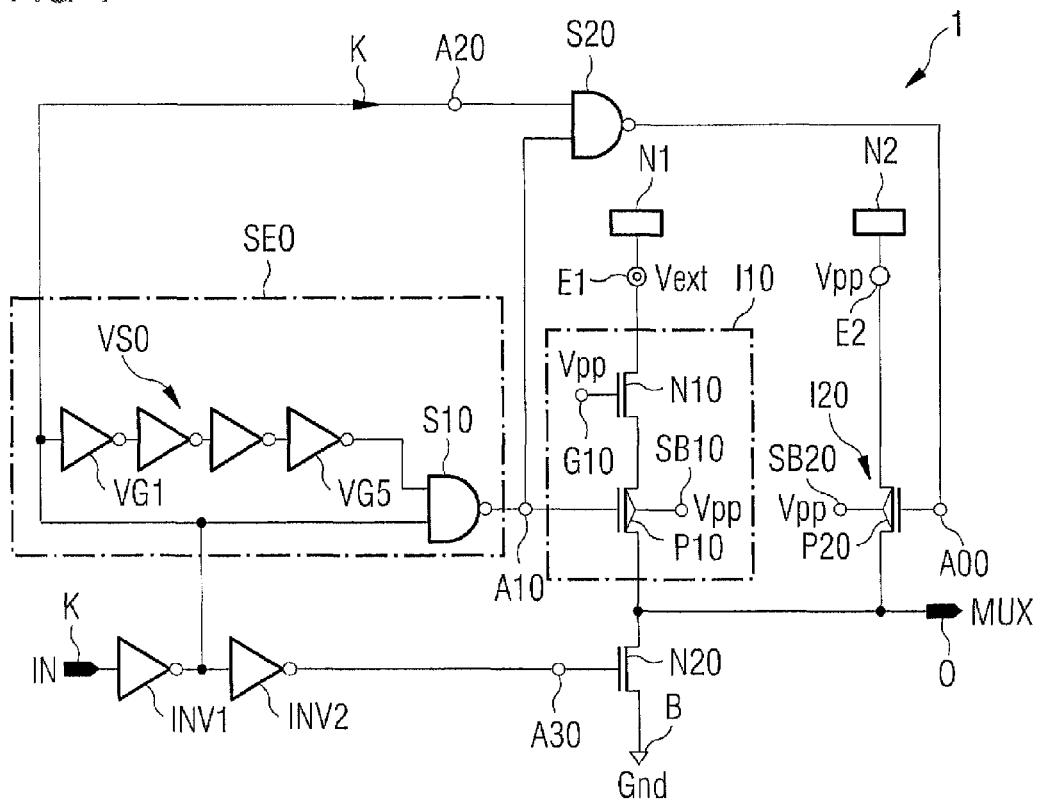
FIG. 1 is an embodiment of an integrated circuit for generating an output signal for switching an isolating transistor.

FIG. 1 shows an embodiment of an integrated circuit 1 for generating an output signal MUX that can be used as a control signal for controlling an isolating transistor in an integrated semiconductor memory. The integrated circuit has an input terminal E1 for applying a supply voltage Vext. The supply voltage Vext is, for example, generated by a voltage network (mains supply) N1, which is connected to the input terminal E1. The input terminal E1 is connected to an output terminal O for generating the output signal MUX via a switching unit I10, which comprises a controllable switch N10 and a controllable switch P10.

Further, the integrated circuit 1 has a first input terminal E2 for applying a voltage Vpp. The voltage Vpp is generated by a further voltage network N2, which is connected to the input terminal E2. After power-up of the integrated semiconductor memory, the voltage Vpp has a level that is higher than the level of the voltage Vext. The input terminal E2 is connected to the output terminal O of the integrated circuit via a switching unit I20 comprising a controllable switch P20. The controllable switches P10 and P20 can be implemented as switching transistors. The substrate terminals SB10 and SB20 of the switching transistors are each connected to the input terminal E2 for applying the voltage Vpp.

Further, the output terminal O is connected to a terminal B for applying a reference voltage Gnd via a controllable switch N20. In the embodiment of FIG. 1, the controllable switches N10 and N20 are each implemented as n-channel field-effect transistors, whereas the controllable switches P10 and P20 are implemented as p-channel field-effect transistors.

For controlling the controllable switches, the integrated circuit has a control terminal K for applying a control signal IN. After a delay by the delay members INV1 and INV2, the control signal IN is supplied to a control terminal A30 of the controllable switch N20. A control terminal A10 of the controllable switch P10 is connected to a control circuit SE0. The control circuit SE0 has a logic gate S10 to which the delayed control signal IN is supplied on the input side. Further, the control circuit SE0 comprises a delay circuit VS0 comprising several delay members VG1, ..., VG5. The logic gate S10 is implemented as NAND gate, which is connected to the control terminal A10 on the output side.

Further, the integrated circuit 1 comprises a logic gate S20, which is also implemented as NAND gate. The control signal IN is supplied in a delayed manner to the NAND gate S20 at a terminal A20 on the input side. A further terminal A10 of the NAND gate S20 is connected to an output side of the NAND gate S10. The NAND gate S20 generates a control signal on the output side, which is supplied to a control terminal A00 of the controllable switch P20.

Figure 2:
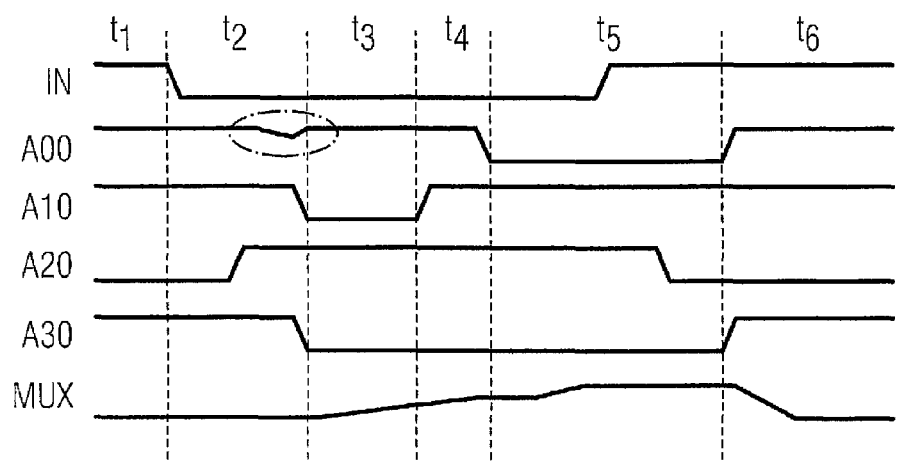
FIG. 2 is a signal diagram for the embodiment of the integrated circuit shown in FIG. 1.

The mode of operation of the integrated circuit 1 will be described with regard to FIG. 2. FIG. 2 shows the waveforms of the control signal IN at the terminal K as well as the waveform of the output signal MUX and the waveforms at the terminals A00, A10, A20 and A30. During a time t1, the control terminal K is controlled by a high level of the control signal IN. Thereby, the switching transistors P10 and P20 are controlled to be non-conductive, wherein the controllable switch N20 is controlled to be conductive. Thus, the output terminal O is connected to the terminal B for applying the reference voltage Gnd, so that the control signal MUX has a low level.

At the time t2, the control signal IN is applied to the control terminal K with a low level. Thereby, the controllable switch N20 remains controlled to be conductive at first and the controllable switch P10 remains controlled to be non-conductive. At the time t3, the signal at the terminal A10 changes to a lower level, whereby the controllable switch P10 is controlled to be conductive. The controllable switch P20 remains non-conductive. Further, a state change of a signal applied to the terminal A30 occurs, whereby the controllable switch N20 is controlled to be non-conductive.

After the signal applied to the input side of the delay circuit VS0 has passed through the delay circuit, the signal at the terminal A10 at the time t4 changes to a high level. Thereby, the controllable switch P10 is non-conductive again. Thus, both controllable switches P10 and P20 are non-conductive at the time t4. At the time t5, the NAND gate S20 generates a low signal level on the output side at the control terminal A00 of the controllable switch P20, whereby the controllable switch P20 is controlled to be conductive, while the controllable switch P10 remains controlled to be non-conductive.

While the output terminal O is fed by the voltage network N1 providing the voltage Vext at the time t3, feeding of the output terminal O takes place via the voltage network N2 providing the voltage Vpp at the time t5. Thereby, the level of the control signal MUX at the output terminal O increases continually. At the time t6, when the control signal IN has a high level again, the controllable switches P10 and P20 are again controlled to be non-conductive, whereas the controllable switch N20 connects the output terminal O to the terminal B to be conductive for applying the reference voltage Gnd. Thereby, the level at the output terminal O decreases again.

By the integrated circuit shown in FIG. 1, the output terminal O is, at first, connected to the input terminal E1 where the voltage Vext is provided. Subsequently, the voltage network N1 is separated from the output terminal O and the input terminal E2, where the higher voltage Vpp is provided, is connected to the output terminal O. Thereby, the output signal MUX is first pulled to the non-pumped external voltage Vext and then to the increased voltage level Vpp. By increasing the voltage in two stages, current consumption can be reduced.

During power-up of an integrated memory, the so-called power-up state of the memory, the voltage Vpp still has a level lying below the level of the external supply voltage Vext. In this case, the well-source diode of the p-channel field-effect transistor P10 driving the output signal MUX against the voltage Vext is controlled to be conductive. During power-up of the memory chip, the input signals of the Vpp logic are not yet defined, which can result in a state of the memory chip having such a high current consumption that the chip is damaged or the voltage supply of the overall system breaks down. Thus, a barrier has to be provided between the voltage network N1 for providing the voltage Vext and the voltage network N2 for providing the pumped voltage Vpp that protects the voltage network N2 from a low-impedance connection to the voltage network N1 during power-up of the memory chip.

In the circuitry shown in FIG. 1, protection of the voltage network N2 is obtained by the control circuit SE0 with the delay circuit VS0 and the NAND gate S10 and by the NAND gate S20. The voltage Vext generated at the input terminal A1 is switched via the NAND structure S10, whereby the voltage Vext is disconnected from the output terminal O after a fixed time. After a delay time resulting from the NAND gate S20, the input terminal E2 for providing the voltage Vpp is connected to the output terminal O.

For protecting the voltage network N2 during power-up of the memory, an n-channel field-effect transistor N10 is connected between the transistor P10 including the critical well-source diode, and the input terminal E1 for applying the voltage Vext. A control terminal G10 of the transistor N10 is permanently clamped to the voltage Vpp, whereby, in a fully charged Vpp network, the input terminal E1 for providing the voltage Vext is connected to the output terminal O by the switching unit I10. During power-up of the memory chip, however, the voltage Vpp is smaller than the voltage Vext. Thereby, the well-source diode of the transistor P10 is controlled to be conductive, but the connection between the voltage networks N1 and N2 is interrupted, since the gate-source voltage at N10 is too small.

Figure 3:
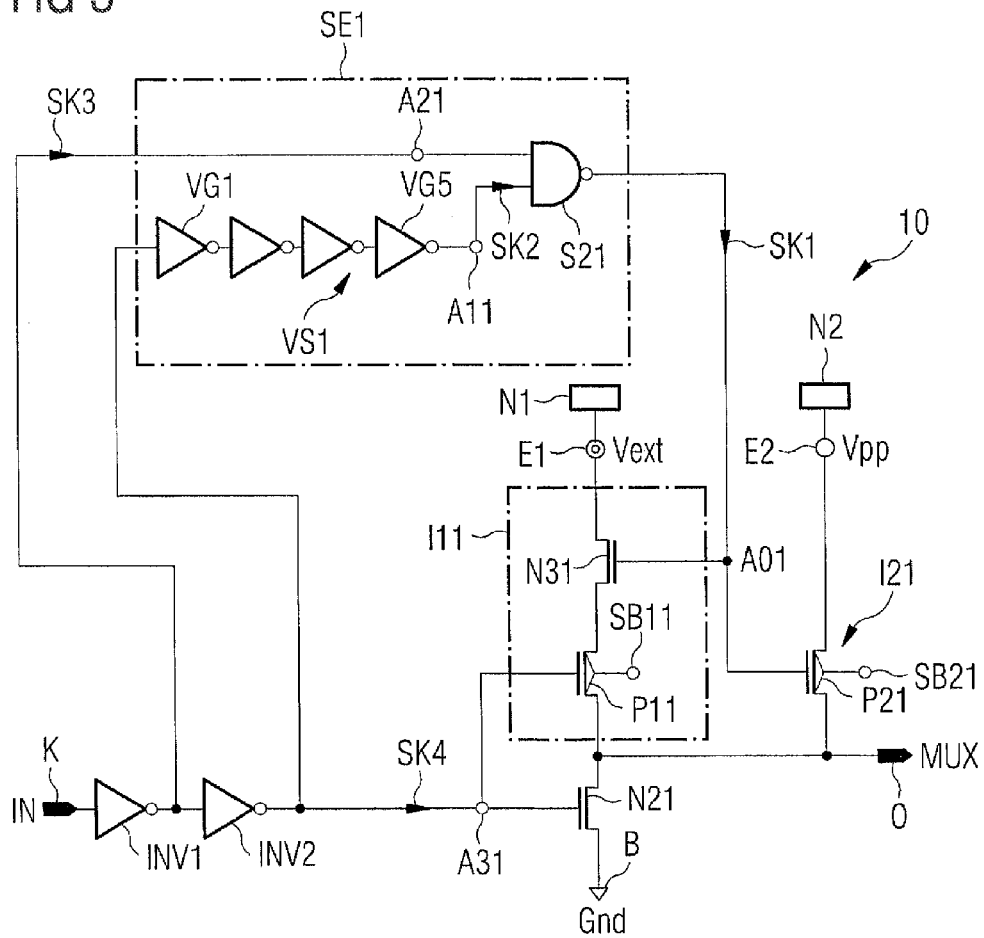
FIG. 3 is a second embodiment of an integrated circuit for generating an output signal for switching an isolating transistor.

FIG. 3 shows a further embodiment of an integrated circuit 10 for generating an output signal MUX, which can, for example, be used as a control signal for controlling isolating transistors of an integrated semiconductor memory. Thereby, the output signal MUX is generated with a voltage level lying above a voltage level of the externally provided supply voltage Vext.

The voltage Vext is provided at an input terminal E1 of the integrated circuit 10. The voltage Vext can, for example, be an external supply voltage, which is generated by a voltage network N1, which is connected to the input terminal E1. The input terminal E1 is connected to an output terminal O of the integrated circuit for generating the output signal MUX via a switching unit I11 comprising a controllable switch N31 and a controllable switch P11. Further, the integrated circuit has an input terminal E2 where a voltage Vpp is provided. After power-up of a memory chip, in which the circuit 10 can be integrated, the voltage Vpp has a voltage level lying above the voltage level of the external supply voltage Vext. For generating the voltage Vpp, a voltage network N2 can be connected to the input terminal E2, by which the voltage Vext is pumped to the increased level Vpp. The input terminal E2 is connected to the output terminal O of the integrated circuit via a switching unit I21, which includes a controllable switch P21. The controllable switches can be implemented, for example, as field-effect transistors. The voltage Vpp is fed in at a substrate terminal SB11 of the transistor P11 as well as at a substrate terminal SB21 of the transistor P21. Therefore, the substrate terminal can, for example, be connected to the input terminal E2.

In order to pull the output signal MUX to a lower level, a controllable switch N21 is provided, which is connected between a terminal B for applying a reference voltage Gnd and the output terminal O. The controllable switches N31, P11 of the switching unit I11, the controllable switch P21 of the switching unit I21 as well as the controllable switch N21 can, for example, be implemented as field-effect transistors or as controllable resistors.

A control switch SE1 is provided for controlling the controllable switch N31 and the controllable switch P21. For controlling the controllable switches N31, P11 of the switching unit I11, for controlling the controllable switch P21 of the switching unit I21, and for controlling the controllable switch N21, the control signal IN is applied to a control terminal K of the integrated circuit 10. The control signal IN is supplied to a delay circuit INV1, which generates an internal control signal SK3 on the output side, which is supplied to the control circuit SE1. After a further delay by a delay circuit INV2, a further internal control signal SK4 is generated from the internal control signal SK3, which is supplied to a further input side of the control circuit SE1. Further, the internal control signal SK4 serves for controlling the controllable switches P11 and N21.

The internal control signal SK4 is supplied to a delay circuit VS1 of the control circuit SE1. The delay circuit VS1 comprises several delay members VG1, ..., VG5. The delay circuit VS1 is connected to a terminal A11 of a logic gate S21 on the output side. After delaying the internal control signal SK4, the delay circuit VS1 generates an internal control signal SK2 at the terminal A11, which is supplied to the logic gate S21. The logic gate is advantageously implemented as NAND gate.

After connecting the states of the internal control signals SK2 and SK3, the NAND gate S21 generates an internal control signal SK1 on the output side. The internal control signal SK1 is supplied to a common control terminal A01 of the controllable switches N31 and P21. The controllable switches N31 and P21 are controlled in dependence on the internal control signal SK1.

Figure 4:
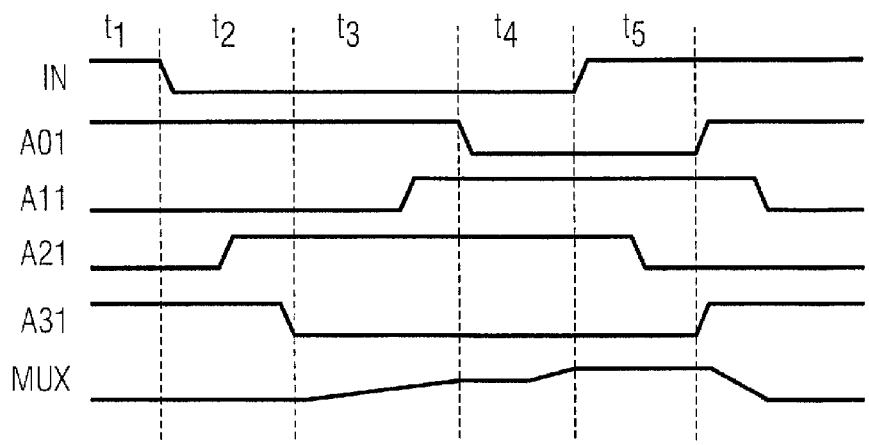
FIG. 4 is a signal diagram for the embodiment of the integrated circuit shown in FIG. 3.

The mode of operation of the integrated circuit 10 will be illustrated below with regard to FIG. 4. In FIG. 4, the waveforms of the control signal IN and the output signal MUX as well as the waveforms of the internal control signals SK1 at the terminal A01, the internal control signal SK2 at the terminal A11, the internal control signal SK3 at the terminal A21, and the internal control signal SK4 at the terminal A31 are illustrated.

During a time t1, a high level of the control signal IN is applied to the control terminal K. By the high level of the control signal IN, the controllable switches P11 and P21 are non-conductive. The controllable switch N31 is controlled to be conductive. Further, the controllable switch N21 is controlled to be conductive so that the output signal MUX is pulled to a level of the reference voltage Gnd. At the time t2, a state change of the control signal IN is applied to the control terminal K.

At the time t3, the internal control signal SK4 at the control terminal A31 of the controllable switches P11 and N21 changes to a lower signal level. Thereby, the controllable switch N21 is non-conductive and the controllable switch P11 is controlled to be conductive. Since the internal control signal SK1 assumes no state change, the controllable switch N31 remains controlled to be conductive and the controllable switch P21 remains controlled to be non-conductive. Thus, the output terminal O is connected to the input terminal E1 for applying the external supply voltage Vext via the controllable switches P11 and N31. Thereby, the level of the output signal MUX increases slowly.

At the time t4, the control circuit SE1 generates a state change of the internal control signal SK1 at the NAND gate S21 on the output side. By the low level of the internal control signal SK1, the controllable switch N31 is controlled to be non-conductive. The controllable switch P21 is controlled to be conductive. The controllable switch P11 remains controlled to be conductive. Since the controllable switch N31 is controlled to be non-conductive when the controllable switch P21 is controlled to be conductive, no delay occurs when charging the output terminal O. The charging process at the output terminal is continued by the connection of the input terminal E2 to the output terminal O. Thus, the level of the output signal MUX increases further until the output terminal O has the increased voltage level Vpp. The increased level of the output signal MUX can be used for controlling isolated transistors of an integrated semiconductor memory to be conductive.

At the time t5, a state change of the control signal IN is applied to the control terminal K. Thereby, the controllable switches P11 and P21 are controlled to be non-conductive, and the controllable switch N31 is again controlled to be conductive. Through the controllable switch N21 controlled to be conductive, the output terminal O is connected to the terminal B for applying the reference voltage Gnd, and can thus discharge. Since the controllable switch N31 is already controlled to be conductive, it is made possible to connect the input terminal E1 to the output terminal O via the controllable switch P11 without delay during subsequent charging of the output terminal O.

In the embodiment of the integrated circuit 10 shown in FIG. 3, the driver circuit P11 is no longer non-conductive when the driver circuit P21 is controlled to be conductive, but remains permanently controlled to be conductive as long as the output signal MUX is held on the voltage level Vpp. Thus, no pulser circuit for controlling the driver circuit P11 is necessitated. However, for disconnecting the external voltage network N1 from the voltage network N2, the controllable switch N31 is used instead. The controllable switch N31 has a common control terminal A01 with the controllable switch P21. The two controllable switches N31 and P21 are controlled by the same internal control signal SK1. Thereby, the voltage network N2 is connected to the output terminal O via the controllable switch P21 in a delayed manner with regard to the voltage network N1.

Since in the embodiment shown in FIG. 3, the controllable switch N31 is a field-effect transistor of the n-channel type, the controllable switch P21 is a field-effect transistor of the p-channel type, the controllable switch N31 is non-conductive when the controllable switch P21 is controlled to be conductive. Thus, when switching the voltage networks for providing the voltage Vext and the voltage Vpp on and off, no delay occurs.

When the output signal MUX is again pulled to the reference voltage Gnd, for example, to isolate a bit line pair from a read amplifier, the driver circuit P11 and the driver circuit P21 are controlled to be non-conductive by the internal control signal SK4 and the internal control signal SK1, respectively. Thereby, the controllable switch N31 is controlled to be conductive. Thereby, becoming impossible to switch the voltage network N1 for providing the external supply voltage Vext to the output terminal O without delay by controlling the driver circuit P11 to be conductive, during the next connection of the read amplifier to the connected bit line pair.

Further, the controllable switch N31 takes on the protection of the voltage network N2 for providing the increased voltage Vpp from a low-impedance connection with the voltage network N1 for providing the external supply voltage Vext. Such protection is particularly necessitated during power-up of the circuit 10 and during power-up of a memory chip in which the circuit 10 is integrated, respectively. Since the voltage level of the internal control signal SK1 at the terminal A01 is undefined at first during power-up of the integrated circuit, two cases are distinguished.

In the first case, it is assumed that the terminal A01 is pulled to a voltage close to the reference voltage Gnd, for example, to a ground potential, by the NAND gate S21. In this case, the controllable switch N31 is controlled to be non-conductive. The well-source diode of the controllable switch P11 is opened, but disconnected from the terminal E1 for applying the external supply voltage Vext by the controllable switch N31 controlled to be non-conductive. Thereby, it is avoided that leakage current flows from the voltage network N2 into the voltage network N11.

In the second case, it is assumed that the NAND gate S21 pulls the terminal A01 to the increased voltage potential Vpp. In this case, the controllable switch N31 is controlled to be non-conductive, as long as the level of the voltage Vpp generated by the voltage network N2 lies below the level of the external supply voltage Vext generated by the voltage network N1, since the gate-source voltage is too small. When the voltage level Vpp provided by the voltage network N2 is already higher than the external voltage level Vext, the controllable switch N31 is controlled to be conductive, but in this case the well-source diode of the controllable switch P11 is controlled to be non-conductive.

Compared to the embodiment of the integrated circuit 1 shown in FIG. 1, about 20% of the overall circuit area of the integrated circuit is saved in the embodiment of the integrated circuit 10 illustrated in FIG. 10, since the NAND gate S10 for controlling the controllable switch P11, as well as the controllable switch N10, are omitted. Further, the voltage network for providing the external supply voltage Vext is disconnected without delay, and the voltage network N2 for providing the voltage Vpp is connected without delay. Thereby, the charging process for charging the output terminal O by the voltage network N1 is only interrupted when the charging process is continued by the voltage network N2. Thereby, the charging time for generating the output signal MUX with the increased voltage level Vpp at the output terminal O is reduced.

Figure 5:
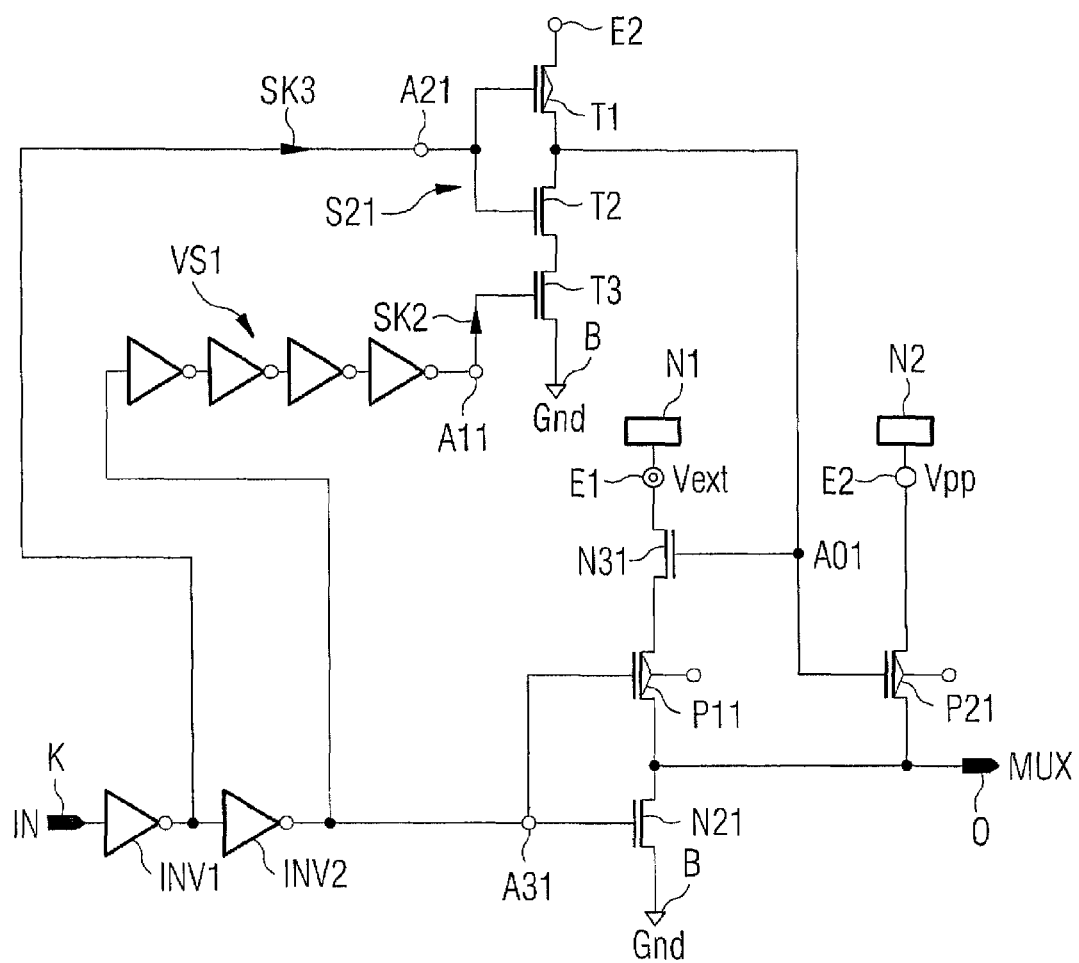
FIG. 5 is a third embodiment of an integrated circuit for generating an output signal for switching an isolating transistor.

FIG. 5 shows a further embodiment of the integrated circuit 10. Here, the same circuit parts as in FIG. 3 are provided with the same reference numbers. Particularly, FIG. 5 shows an inner connection of the NAND gate S21. The NAND gate S21 comprises a controllable switch T1 connected between the input terminal E2 and the terminal A01. Further, a series connection of controllable switches T2 and T3 is connected between the terminal A01 and a terminal B for applying a reference voltage Gnd.

The controllable switch T1 is, for example, implemented as a field-effect transistor of the p-channel type, whereas the controllable switches T2 and T3 can be implemented as field-effect transistors of the n-channel type. The control terminals of the transistors T1 and T2 are connected to the terminal A21, to which the internal control signal SK3 is supplied. The transistor T3 is controlled by the internal control signal SK2, which is generated by the delay circuit VS1. Since no glitch occurs at the terminal A01 in the time t2 of FIG. 4, and thus the driver circuit P21 remains securely non-conductive, providing a second field-effect transistor of the p-channel type connected to the transistor T1 in series with the terminal E2 is not necessitated for realizing the NAND gate S21. Since typical switching times for connecting the voltage networks N1 and N2 to the output terminal O are in the nanosecond range, lowering of the potential at the terminal A01 by leakage current is not critical and the terminal A01 can remain in a floating potential state during the switching time.

Figure 6:
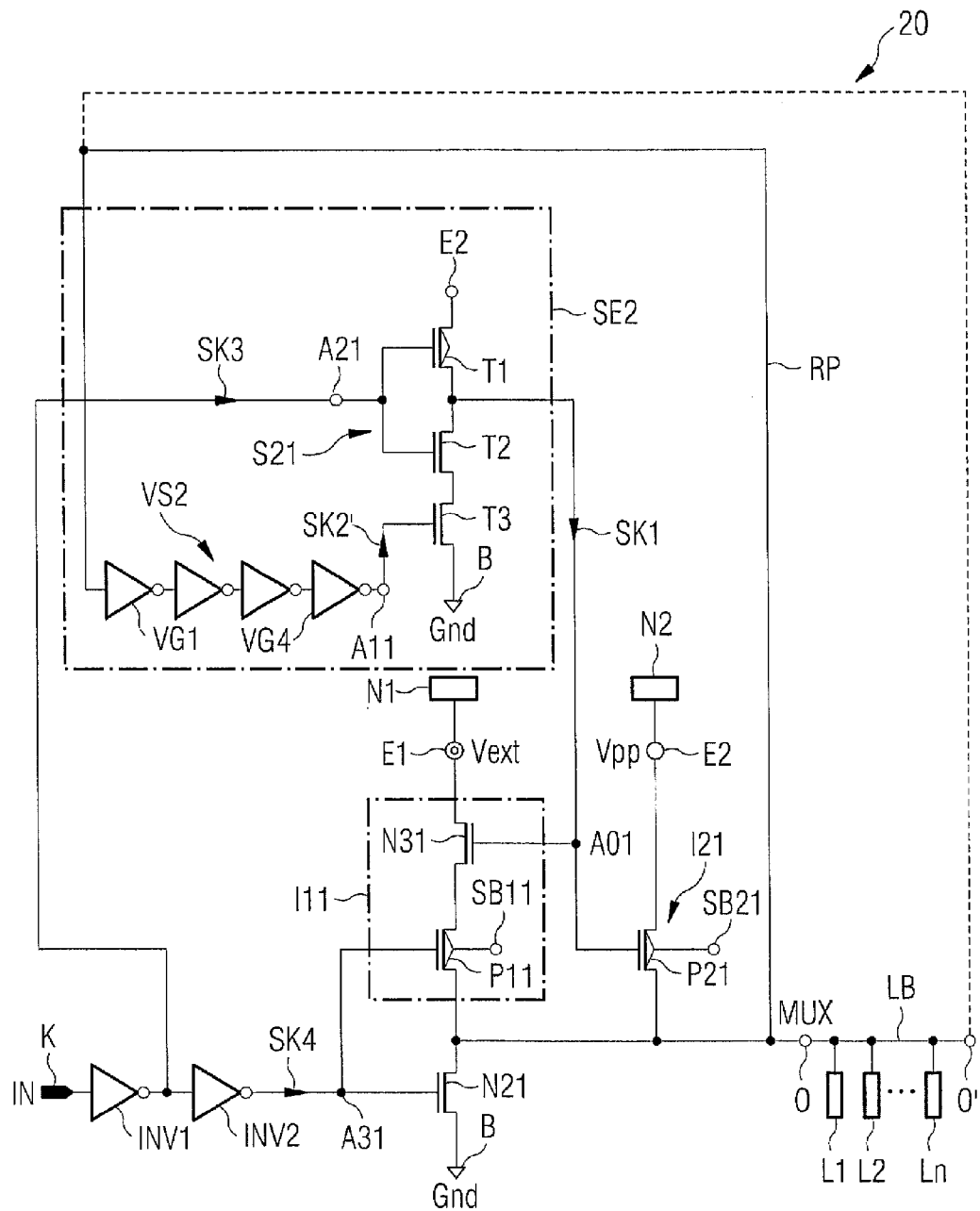
FIG. 6 is a fourth embodiment of an integrated circuit for generating an output signal for switching an isolating transistor.

FIG. 6 shows a further embodiment of an integrated circuit 20 for generating the output signal MUX. Contrary to the embodiment shown in FIG. 5, an internal control signal SK2' for controlling the transistor T3 of the NAND gate S21 is not derived from the control signal IN, but generated by feedback of the output signal MUX to a control circuit SE2. The output signal MUX is delayed by a delay circuit VS2 of the control circuit SE2 comprising the delay members VG1, . . . , VG4 and provided as the internal control signal SK2' at the terminal A11.

In this switching variation, the voltage network N1 for providing the external supply voltage Vext remains connected to the output terminal O until the level of the output signal MUX has risen to a defined value, so that the voltage network N1 can be disconnected and the voltage network N2 can be connected. Thereby, it becomes possible to derive the load carried by the voltage network N1 in a flexible manner from the charging speed at the output terminal O.

If, for example, a long conductive trace LB with a heavy load L1, L2, . . . , Ln distributed across the line is connected to the output terminal O, a feedback path RP, through which the output signal MUX is supplied to the control circuit, can also, for example, be connected to a terminal O' at the end of the conductive trace LB. Thereby, it is avoided that the voltage network N2 for providing the voltage Vpp is already connected to the output terminal O when the voltage at the output terminal O has a sufficient level, but the voltage at the end of the conductive trace LB still has a lower level.

Since the typical starting voltages of the n-channel transistors of the NAND gate S2 lie below a voltage level of the external supply voltage Vext, or for balancing out RC time constants of the output signal MUX, respectively, an additional delay can be provided between the output terminal O and the terminal A11 of the NAND gate S2. This additional delay is effected, for example, by the delay members VG1, . . . , VG4 of the delay circuit VS2.

Figure 7:
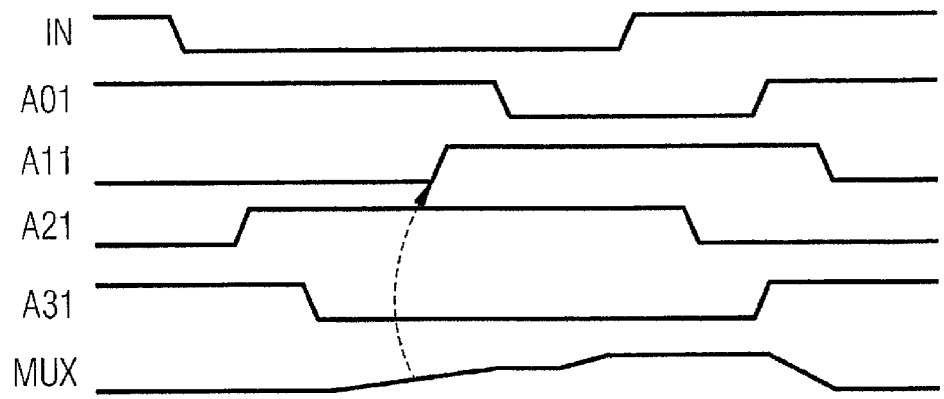
FIG. 7 is a signal diagram for the embodiment of the integrated circuit shown in FIG. 6.

FIG. 7 shows signal states of the control signal IN, the output signal MUX, as well as the internal control signals SK1, SK2', SK3 and SK4 at the terminals A01, A11, A21 and A31 in the circuit 20 illustrated in FIG. 6. The signal diagram is similar to the signal diagram of FIG. 4. The arrow indicates the dependence of the rising edge of the internal control signal SK2' at the terminal A11 from the waveform of the output signal MUX. In the waveforms shown in FIG. 7, no glitch occurs at the terminal A01. Thus, even in this implementation of the integrated circuit, a second field-effect transistor of the p-channel type can be omitted in the structure of the NAND gate S21.

Figure 8:
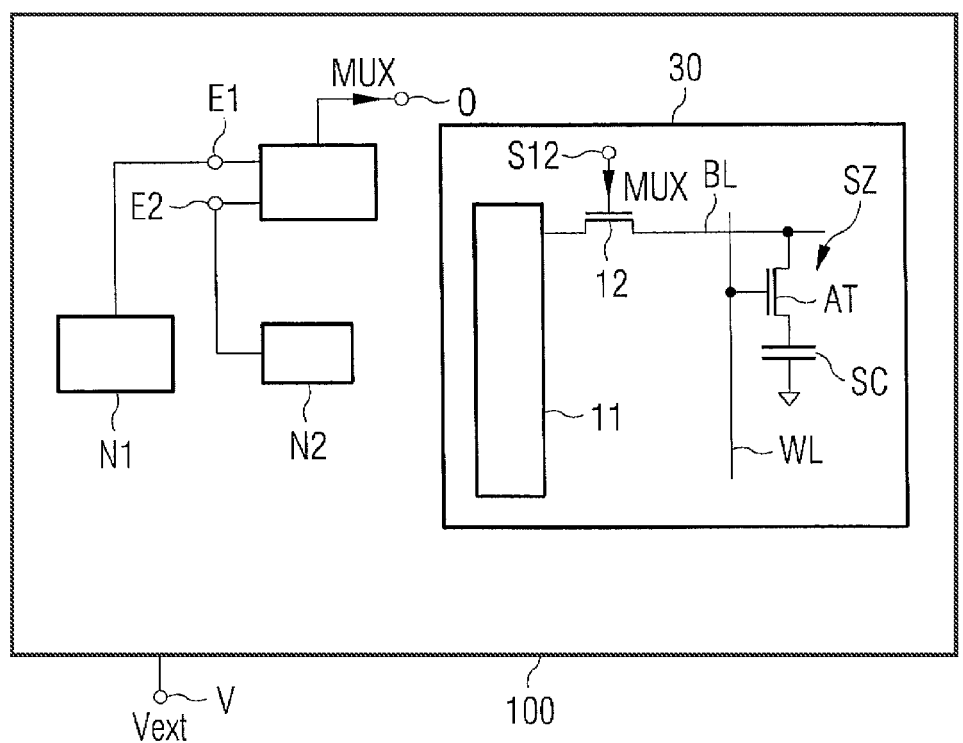
FIG. 8 is an embodiment of an integrated semiconductor memory having an integrated circuit for generating an output signal for switching isolating transistors.

FIG. 8 shows a memory chip 100, where the integrated circuit 1, 10, 20 is used for generating an output signal MUX. The output signal MUX serves as a control signal for controlling an isolating transistor 12 connecting a read amplifier 11 to a bit line BL. The read amplifier 11 and the isolating transistor 12 are arranged in a memory cell field 30. The memory cell field 30 has a plurality of memory cells SZ, which are connected between bit lines BL and word lines WL.

The memory cells SZ can, for example, be DRAM (dynamic random access memory) memory cells. A DRAM memory cell SZ, illustrated exemplarily in FIG. 8, has a memory capacitor SC that is connected to the bit line BL via a controllable switch, for example, a selection transistor AT. For reading out the memory cell SZ or for writing a data value into the memory cell SZ, respectively, the memory cell SZ is activated by a corresponding control signal on the word line WL and connected to the bit line BL to be conductive.

During memory access to memory cells connected to the bit line BL, the integrated circuit 1, 10, 20 generate the output signal MUX at its output terminal O, which is supplied to a control terminal S12 of the isolating transistor 12. By the increased level of the control signal, the isolating transistor is controlled to be conductive, so that the bit line BL is connected to the read amplifier 11.

For generating the increased voltage level Vpp, the output signal MUX provided by the circuit 1, 10 or 20, respectively, is first raised to the level of the external supply voltage Vext by the voltage network N1 and then to the level of the increased voltage Vpp. The external supply voltage Vext can be supplied to the semiconductor memory, for example, at a supply terminal V. It is also possible that the voltage Vext is generated on the memory chip of the semiconductor memory from an externally supplied voltage by a voltage network N1, which includes, for example, a voltage generator circuit. The increased voltage level Vpp is generated, for example, by the voltage network N2, which can include a pump circuit. The integrated circuit ensures, particularly during power-up of the memory chip, that no low-impedance connection between the voltage network N1 for providing the voltage Vext and the voltage network N2 for providing the voltage Vpp is caused by the integrated circuit 1, 10, 20.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An integrated circuit, comprising:
an input terminal for receiving an input signal;
a further input terminal for receiving a further input signal having a level different from a level of the input signal;
an output terminal for providing an output signal;
a switching unit comprising a first controllable switch and a second controllable switch connected in series between the input terminal and the output terminal such that the output signal depends upon the input signal when the first and second controllable switches are both closed; and
a further switching unit comprising a third controllable switch connected between the further input terminal and the output terminal such that the output signal depends upon the further input signal when the third controllable switch is closed;
wherein the integrated circuit is operated in a first and a subsequent second operating state,
wherein the switching unit is implemented such that the first controllable switch of the switching unit is controlled to be conductive in the first and second operating states, the second controllable switch of the switching unit is controlled to be conductive in the first operating state and non-conductive in the second operating state, and, in the first operating state, the output signal is provided in dependence on a level of the input signal, and
wherein the further switching unit is implemented such that the third controllable switch of the further switching unit is controlled to be non-conductive in the first operating state and conductive in the second operating state, and, in the second operating state, the output signal is provided in dependence on a level of the further input signal; and
a control circuit for controlling the second controllable switch of the switching unit and the third controllable switch of the further switching unit such that the second controllable switch is conductive when the third controllable switch is non-conductive and the third controllable switch is conductive when the second controllable switch is non-conductive.

2. The integrated circuit according to claim 1, further comprising:
a control terminal for applying a control signal, wherein the integrated circuit is operated in the first and the subsequent second operating state when applying a state of the control signal,
wherein the first controllable switch and the second controllable switch of the switching unit and the third controllable switch of the further switching unit are controlled in dependence on the state of the control signal.

3. The integrated circuit according to claim 1, further comprising:
a terminal for applying a reference voltage;
a fourth controllable switch connected between the terminal for applying a reference voltage and the output terminal,
wherein the first controllable switch of the switching unit and the fourth controllable switch comprise a common control terminal for applying a control signal for respectively controlling the first and fourth controllable switches such that the first controllable switch is conductive when the fourth controllable switch is non-conductive and the fourth controllable switch is conductive when the first controllable switch is non-conductive.

4. The integrated circuit according to claim 1,
wherein the control circuit comprises a delay circuit with an adjustable delay time,
wherein the second controllable switch of the switching unit and the third controllable switch of the further switching unit are controlled in dependence on the adjustable delay time.

5. An integrated circuit, comprising:
a terminal for applying a voltage level;
a further terminal for applying a voltage level;
a terminal for applying a reference voltage;
an output terminal;
a switching unit having a first controllable resistor and a second controllable resistor connected in series between the terminal and the output terminal;
a further switching unit having a third controllable resistor connected between the further terminal and the output terminal;
a control terminal for applying a control signal;
a control circuit for controlling the first controllable resistor and the third controllable resistor, and
a controllable switch for connecting the output terminal to the terminal for applying a reference voltage,
wherein the controllable switch and the second controllable resistor of the switching unit comprise a first common control terminal for applying a control signal for respectively controlling the second controllable resistor of the switching unit and the controllable switch,
wherein the control circuit, when the control signal is applied to the control terminal, controls the first controllable resistor of the switching unit to have a lower impedance during a first time than during a subsequent second time,
wherein the control circuit, when the control signal is applied to the control terminal, controls the third controllable resistor of the further switching unit to have a lower impedance during the second time than during the first time,
wherein the first common control terminal is controlled in a delayed manner by the control signal,
wherein the control circuit comprises a delay circuit for delaying the control signal by a delay time, and
wherein the control circuit determines the first and second times in dependence on an adjustable delay time.

6. An integrated circuit, comprising:
a terminal for applying a voltage level;
a further terminal for applying a voltage level;
a terminal for applying a reference voltage;
an output terminal;
a switching unit having a first controllable resistor and a second controllable resistor connected in series between the terminal and the output terminal;
a further switching unit a third controllable resistor connected between the further terminal and the output terminal;
a control terminal for applying a control signal;
a control circuit for controlling the first controllable resistor and the third controllable resistor, and a controllable switch for connecting the output terminal to the terminal for applying a reference voltage, wherein the controllable switch and the second controllable resistor of the switching unit comprise a first common control terminal for applying a control signal for respectively controlling the second controllable resistor of the switching unit and the controllable switch, wherein the control circuit, when the control signal is applied to the control terminal, controls the first controllable resistor of the switching unit to have a lower impedance during a first time than during a subsequent second time, wherein the control circuit, when the control signal is applied to the control terminal, controls the third controllable resistor of the further switching unit to have a lower impedance during the second time than during the first time, wherein the first common control terminal is controlled in a delayed manner by the control signal, wherein the control circuit comprises a logic gate comprising first and second terminals, wherein the control signal is supplied to the first terminal of the logic gate delayed by a delay time of a delay circuit, and wherein the control signal is supplied to the second terminal of the logic gate delayed by a further delay time.

7. The integrated circuit according to claim 6, wherein the first and third controllable resistors comprise a second common control terminal, wherein the logic gate comprises a first transistor connected between the further terminal and the second common control terminal of the first and third controllable resistors, and wherein the logic gate further comprises a series connection of at least second and third transistors, which are connected between the second common control terminal of the first and third controllable resistors and the terminal for applying a reference voltage.

8. The integrated circuit according to claim 7, wherein the first, second and third transistors of the logic gate each comprise a control terminal, wherein the control signal delayed by the further delay time is supplied to the control terminals of the first transistor and the second transistor, and wherein the control signal delayed by the delay time of the delay circuit is supplied to the control terminal of the third transistor.

9. The integrated circuit according to claim 5, wherein an output signal is provided at the output terminal, and wherein the control circuit determines the first and second times in dependence on the output signal.

10. The integrated circuit according to claim 9, wherein the control circuit comprises a delay circuit and a logic gate, and wherein the output signal is supplied to the delay circuit.

* * * * *